United States Patent [19]
Endo

[11] Patent Number: 5,773,868
[45] Date of Patent: Jun. 30, 1998

[54] SEMICONDUCTOR DEVICE AND METHOD OF MANUFACTURING THE SAME

[75] Inventor: Koichi Endo, Tokyo, Japan

[73] Assignee: Kabushiki Kaisha Toshiba, Kawasaki, Japan

[21] Appl. No.: 622,587

[22] Filed: Mar. 26, 1996

[30] Foreign Application Priority Data

Mar. 30, 1995 [JP] Japan .................................. 7-073344

[51] Int. Cl.⁶ .......................... H01L 29/861; H01L 29/06
[52] U.S. Cl. .......................... 257/514; 257/590; 257/347; 257/130; 257/155
[58] Field of Search .................................. 257/130, 155, 257/170, 347, 401, 408, 510, 513, 514, 590, 526

[56] References Cited

U.S. PATENT DOCUMENTS

| | | | |
|---|---|---|---|
| 3,411,051 | 11/1968 | Kilby | 257/526 |
| 4,550,332 | 10/1985 | Wagner | 257/162 |
| 5,043,787 | 8/1991 | Soclof | 257/526 |
| 5,241,210 | 8/1993 | Nakagawa et al. . | |
| 5,587,595 | 12/1996 | Neubrand | 257/162 |

FOREIGN PATENT DOCUMENTS

| | | |
|---|---|---|
| 0 451 454 | 10/1991 | European Pat. Off. . |
| 0 628 966 | 12/1994 | European Pat. Off. . |
| 0 631 305 | 12/1994 | European Pat. Off. . |
| WO 80/01968 | 9/1980 | WIPO . |

OTHER PUBLICATIONS

IEEE Transactions on Electron Devices, vol. 38, No. 7, pp. 1650–1654, Jul. 1991, A. Nakagawa et al., "Breakdown Voltage Enhancement For Devices On Thin Silicon Layer/Silicon Dioxide Film".

Primary Examiner—Jerome Jackson
Attorney, Agent, or Firm—Oblon, Spivak, McClelland, Maier & Neustadt, P.C.

[57] ABSTRACT

A semiconductor device having a dielectric isolation (DI) structure using an SOI substrate or the like. An active region as a main current path of the semiconductor device is sandwiched between DI grooves having a side wall substantially vertical to the main surface of the substrate, and the width W of the main current path between the DI grooves is set to 5 μm or narrower to reduce excessive carriers. The reverse recovery charge $Q_{rr}$ prolonging the turn-off time can be shortened, which enables high speed switching.

19 Claims, 15 Drawing Sheets

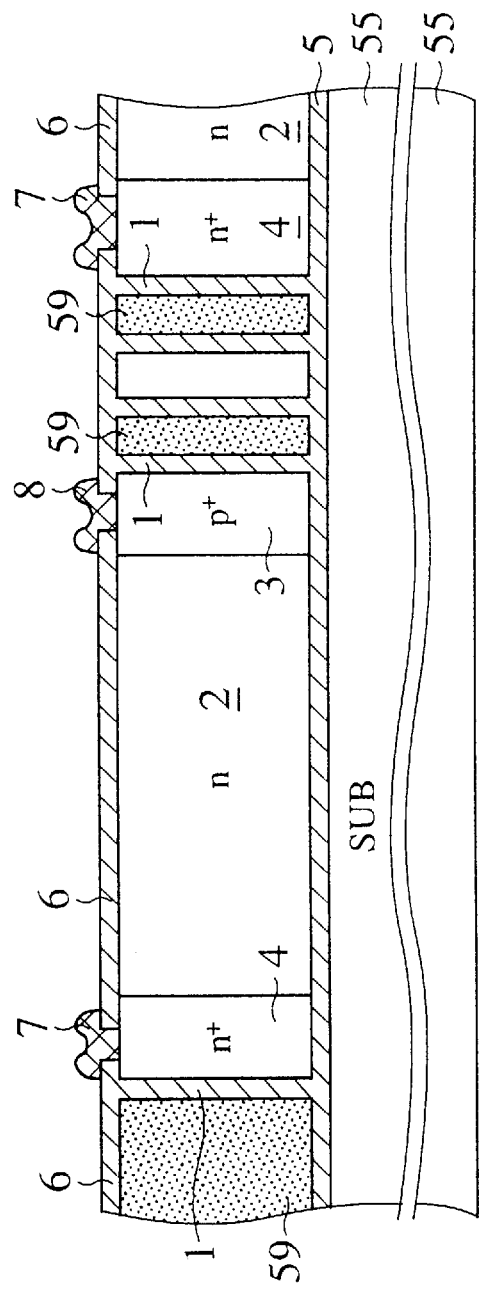
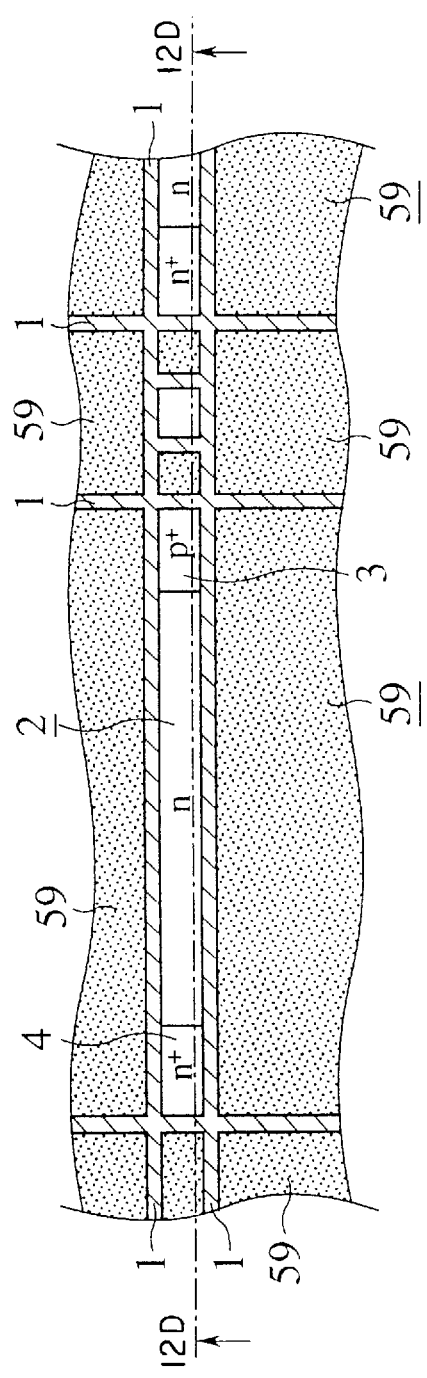
FIG.11A
FIG.11B

CONDUCTIVITY
MODURATION
REGION 5,773,868

SEMICONDUCTOR DEVICE AND METHOD OF MANUFACTURING THE SAME

BACKGROUND OF THE INVENTION

1. Field of the Invention

The present invention relates to high speed power devices such as p-n diodes and insulated gate bipolar transistors (IGBTs) and power ICs using such high speed power devices, and a method of manufacturing the same.

2. Description of the Prior Art

Various element isolation techniques are used for integrated circuit devices. A known typical technique is dielectric isolation (hereinafter called DI). Examples of conventional DI type integrated circuits are shown in FIGS. 1 and 2. FIGS. 1 and 2 show p-n diodes. FIG. 1 shows a DI substrate made by a silicon direct bonding (hereinafter called SDB) method and having V grooved isolation regions. The substrate shown in FIG. 2 is made by an epitaxial passivated IC (EPIC) method. The thickness of a substrate is generally 110 to 50 μm although it depends on a breakdown voltage of the element. A thickness of 10 μm or smaller is difficult for a substrate worked through polishing of current technique.

A reverse recovery waveform of the conventional p-n diodes shown in FIGS. 1 and 2 is shown in FIG. 3. The ordinate represents current, and the abscissa represents time. A reverse recovery time $t_{rr}$ is due to a reverse recovery charge $Q_{rr}$ generated by carriers injected in the forward direction during a turn-on period. Namely, a depletion layer is required to be extended in the pn-junction to eliminate the reverse recovery charge $Q_{rr}$ during a turn-off period. Therefore, the reverse recovery charge $Q_{rr}$ depends on a carrier life time and the total amount of carriers in the diode while current flows in the forward direction. If $Q_{rr}$ is too large, a turn-off time becomes long so that it is desired to be as small as possible, particularly when it is used for driving a motor.

In order to shorten a turn-off time to be caused by $Q_{rr}$, a so-called "carrier lifetime control technique" such as electron beam irradiation and heavy metal diffusion has been used not only for p-n diodes but also for various discrete devices such as IGBT, MOSFET, and GTO. With the carrier lifetime control technique, carrier recombination centers are generated in crystals to extinguish carriers by these recombination centers and reduce the reverse recovery charge $Q_{rr}$.

It is difficult, however, to selectively control the carrier lifetime of only a diode in an integrated circuit. Recombination centers are generated also in other elements of the circuit on the same semiconductor chip. The amplification factor of semiconductor devices, particularly a bipolar transistor, lowers, and leakage current at a Junction increases. Furthermore, since the behavior of heavy metal or the like in semiconductor is unstable and controllability is very poor, the carrier lifetime control technique is associated with disadvantages of inferior manufacture yield. Recombination centers generated for the control of a carrier lifetime lead to the fatal disadvantage that they increase the on-resistance, i.e., a loss during conduction.

A semiconductor device such as a diode and IGBT having a short turn-off time and a small reverse recovery charge $Q_{rr}$ can be manufactured without lifetime control if it is formed on a substrate having a thin active region of, for example, about 5 μm or less. This has been theoretically predicted through numerical simulation. FIG. 4 is a graph showing a relationship between a fall time of an IGBT and a thickness of a silicon-on-insulator (SOI) layer, IGBT being formed in a SOI substrate with DI structure having a silicon thin active region formed on an oxide film. It can be predicted that the thinner the SOI layer, the shorter the fall time. It is also known that a diode such as shown in FIG. 5 has a smaller reverse recovery charge $Q_{rr}$ as the thickness t of the SOI layer 2 is made thinner. The SOI layer 2 of this diode shown in FIG. 5 is formed on an SOI oxide film 5. This structure reduces the volume of the active region more than those structures shown in FIGS. 1 and 2, so that excessive carriers can be extinguished faster during a switching operation. However, it is difficult to make an SOI substrate through SDB method by polishing the active region to about 5 μm thick, because of mechanical strength and generation of crystal defects. Separation by an implanted oxygen (SIMOX) method is most suitable for thinning an active region of an SOI substrate with an SOI oxide film made by oxygen ion implantation. However, a semiconductor device using a SIMOX-SOI substrate has damages left in the active region caused by oxygen implantation. Therefore, a breakdown voltage of the insulating film is low, and the device is not usable for high breakdown voltage (100 V or higher) such as for motors or the like.

SUMMARY OF THE INVENTION

Under the circumstances of the above problems, it is an object of the invention to provide a semiconductor device capable of high speed switching, without fears of mechanical strength, generation of crystal defects, residual damages, and the like.

It is another object of the present invention to provide a semiconductor device such as a diode and an IGBT having a novel structure capable of high speed switching, without using a carrier lifetime control technique.

In order to achieve the above objects, the feature of the present invention resides, as shown in FIGS. 7B, 8, 11A, 14B, 15B, and 16B, in the structure of a semiconductor device which comprises: a bottom insulating film 5 formed on a semiconductor substrate 55; a first semiconductor layer 2, 62 of a first conductivity type having a top, a bottom, and at least four side surfaces formed on the bottom insulating film 5 at a partial area thereof; an element isolation region facing to the side surfaces of the first semiconductor layer 2, 62 and surrounding the first semiconductor layer 2, 62 and having a substantially vertical side wall; an element isolation insulating film 1 formed on the side surface of the first semiconductor layer 2, 62 at an interface between the first semiconductor layer 2, 62 and element isolation region; and a first main electrode region 4, 42, 63 of the first conductivity type and a second main electrode region 3, 43, 64 of a second conductivity type, respectively formed in the first semiconductor layer 2, 62 of the first conductivity type, wherein a current path region formed between the first and second main electrode regions is sandwiched between element isolation insulating films, and the width W of the current path region between the element isolation insulating films is set to 5 μm or narrower. The thickness t of the first semiconductor layer 2, 62, i.e., the distance from the top surface of the first semiconductor layer 2, 62 of the first conductivity type to the bottom surface, or the bottom insulating film 5, is preferably set to 5 μm or longer. According to the invention, as shown in FIGS. 8, 11A, 15B, and 16B, at least one of the first and second main electrode regions is preferably formed reaching the bottom insulating film 5 from the top surface of the first semiconductor layer 2, 62. The first conductivity type is n-type or p-type, and the second conductivity type is a conductivity type different from the first conductivity type. If the first conductivity type is the n-type, the second conductivity type is the p-type, or vice versa.

As shown in FIG. 13, it is preferable that the width $W_K$ of the current path region on the cathode side is different from the width $W_A$ on the anode side and at least one of the widths is set to 5 μm or narrower.

With the above features of the invention, as shown in FIGS. 7A, 10, 11B, 13, 14A, 15A, and 16A, since the main current path or channel is squeezed by the element isolation insulating film 1 to become a region having a narrow width W, excessive carriers to be extinguished during the turn-off period, i.e. the reverse recovery charge $Q_{rr}$ becomes small. Accordingly, the turn-off time can be shortened and high speed switching is possible. The width W is determined basing upon a precision of a distance between element isolation grooves capable of being formed through photolithography. The reverse recovery charge $Q_{rr}$ can be made small without any practical problem of lowered mechanical strength and crystal defects. It is possible to maintain good crystal quality, without forming recombination centers by using lifetime control techniques. Therefore, conduction modulation of IGBT or SI thyristor can be effectively performed and the on-resistance RON can be lowered.

Further, according to the invention, the cathode and anode diffusion regions are formed deeply so that main current can be distributed deeply in the vertical direction from the top surface of the first semiconductor layer. In other words, the effective channel width can be set in the vertical direction from the top surface of the first semiconductor layer without any restriction of a surface area of the semiconductor chip and the pattern layout in plan can be made fine. Accordingly, the effective channel area increases and the on-resistance $R_{ON}$ per chip area can be reduced. This advantageous effects are superposed to the above-mentioned effects of reducing the on-resistance by using high crystal quality first semiconductor layer 2, 62, which is attributed to the fact that no recombination centers are generated by the lifetime control technique. Furthermore, according to the invention, since the turn-off time $\tau_{OFF}$ can be shortened as described above, the $R_{ON}$-$\tau_{OFF}$ tradeoff curve is shifted to a smaller value side which allows high speed and low loss switching.

The structure of the semiconductor device of the invention can be fabricated easily by the manufacturing method illustrated in FIGS. 12A to 12D. For example, the method includes:

(a) a first step of forming a bottom insulating film 5 on a semiconductor substrate 55 by the SDB method and forming a semiconductor layer 2 of the first conductivity type having a top and bottom surfaces on the bottom insulating film 5, as illustrated in FIG. 12A:

(b) a second step of forming a first element isolation groove (trench) 314 from the top surface of the semiconductor layer 2, the first element isolation groove having a side wall substantially vertical to the top surface of the semiconductor layer 2. The side wall acts as a side surface of the semiconductor layer 2. And laterally diffusing impurities of the first or second conductivity type into the semiconductor layer 2 by using the side wall of the first element isolation groove 314 as a diffusion window to form a first main electrode region 4, and thereafter forming an element isolation insulating film 1 on the surface of the first element isolation groove 314 or on the side surface of the semiconductor layer 2, as illustrated in FIG. 12B;

(c) a third step of forming a second element isolation groove 315 from the top surface of the semiconductor layer 2 and spaced apart from the first element isolation groove, the second element isolation groove having a side wall substantially vertical to the top surface of the semiconductor layer 2, and laterally diffusing impurities of a conductivity type opposite to the impurities used at the second step into the semiconductor layer 2 by using the side wall of the second element isolation groove 315 as a diffusion window to form a second main electrode region 3, as illustrated in FIG. 12C;

(d) a forth step of forming third and fourth element isolation grooves continuously with, and perpendicular to, the first and second element isolation grooves to surround the semiconductor layer 2 by the first to fourth element isolation grooves; and (e) a fifth step of forming an element isolation insulating film 1 on the surface of the second to fourth element isolation grooves, or on the side surface of the semiconductor layer 2 and burying the first to fourth element isolation grooves with an element isolation groove burying member 59, as illustrated in FIG. 12D.

In the third step, the second main electrode region may be formed from the top surface of the semiconductor layer 2 through selective impurity diffusion method by using photolithography.

As described above, at least one of the first and second main electrode regions can be formed easily by lateral diffusion by using the side wall of the element isolation groove 314, 315 as a diffusion window. Therefore, there is no problem which might otherwise be caused by a thermal treatment at a high temperature for a long time, and a problem of excessive lateral diffusion due to deep diffusion can be eliminated. Accordingly, the productivity is improved and there is no problem of defects to be induced by a thermal treatment. Furthermore, the diode structure can be made fine. Uniformity and reproductivity are superior because lifetime control technique which is very poor in controllability is not used. The productivity such as manufacture yield is very fine.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 11A is a cross sectional view of a p⁺nn⁺ diode according to a third embodiment of the invention, and FIG. 11B is a plan view of the p⁺nn⁺ diode of the third embodiment.

DETAILED DESCRIPTION OF THE EMBODIMENTS

Figure 1:
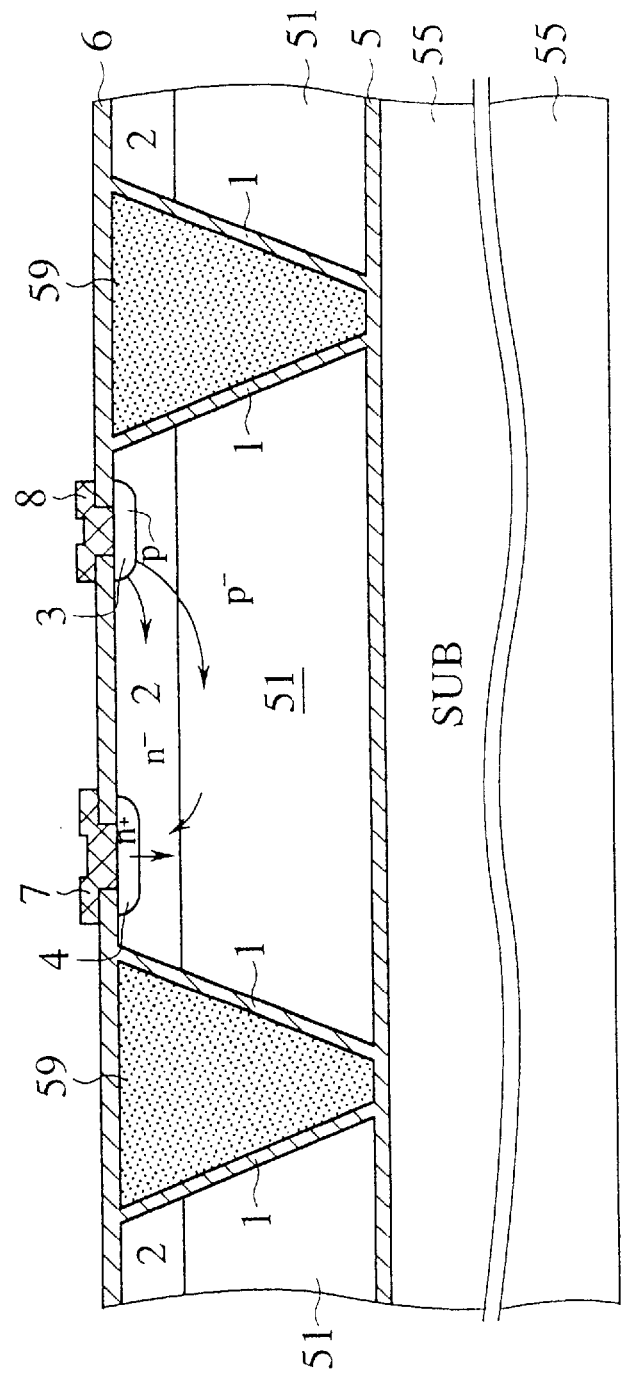
FIG. 1 is a cross sectional view of a diode using an SOI substrate according to conventional DI technique.
Figure 2:
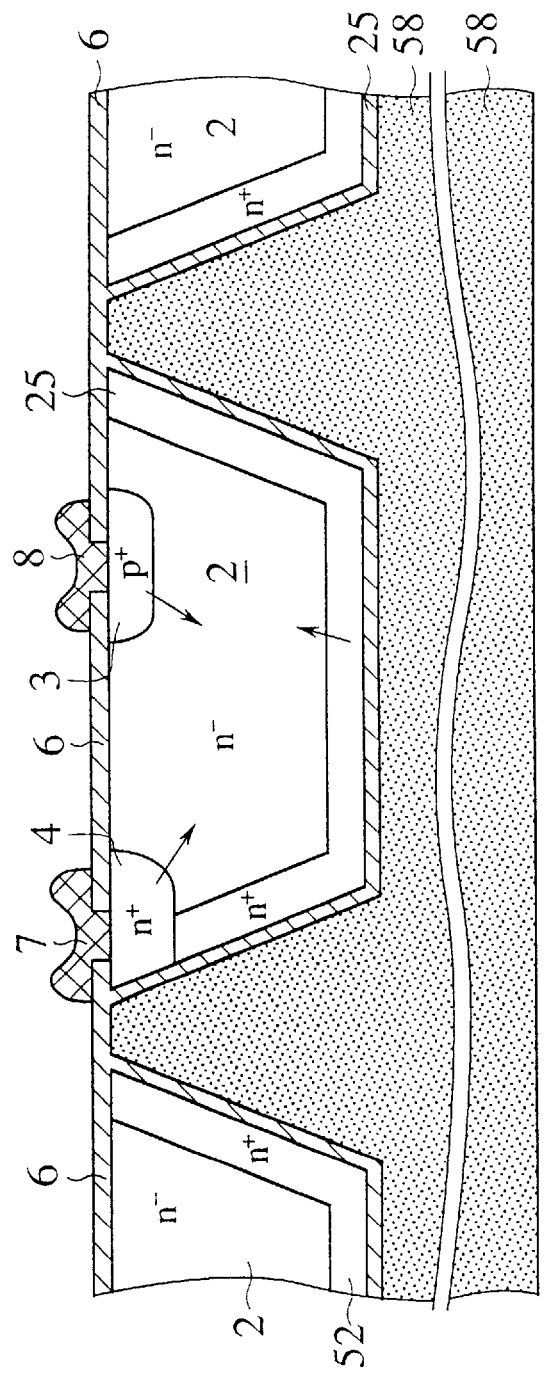
FIG. 2 is a cross sectional view of a conventional diode using a substrate made through EPIC.
Figure 3:
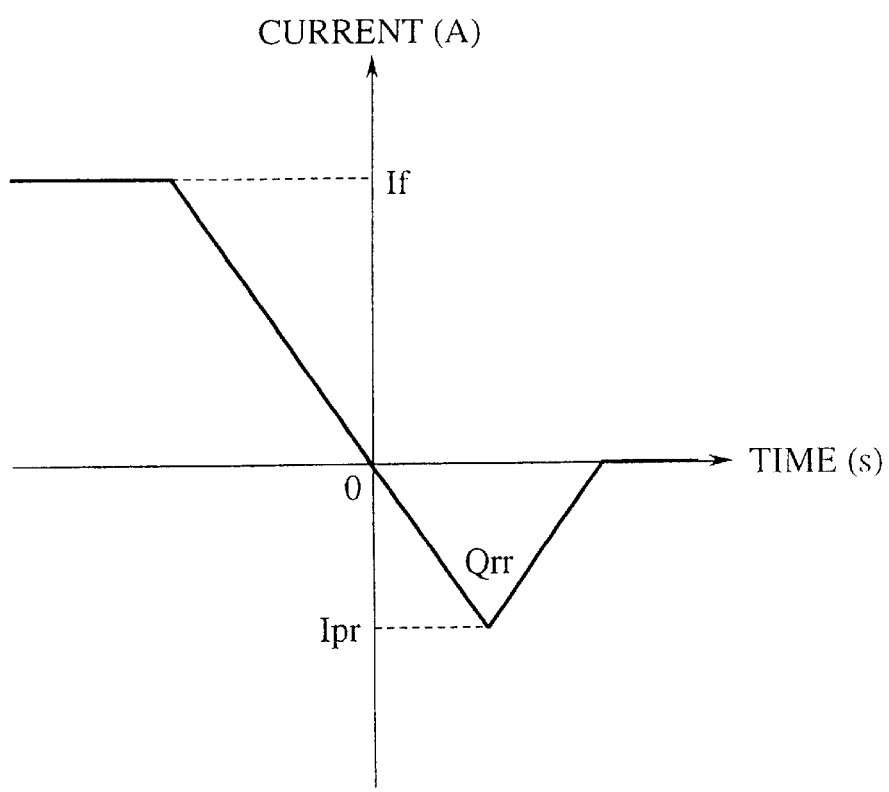
FIG. 3 is a diagram showing a reverse recovery waveform during a turn-off period of a diode.
Figure 4:
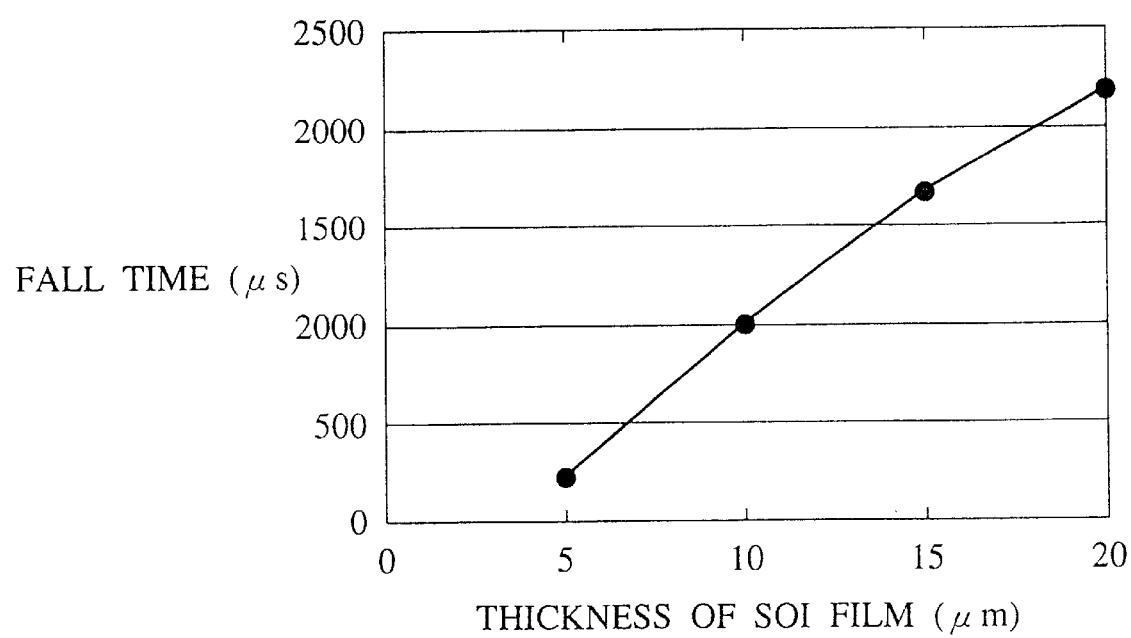
FIG. 4 is a graph showing a relationship between a thickness of an SOI layer and a fall time.
Figure 5:
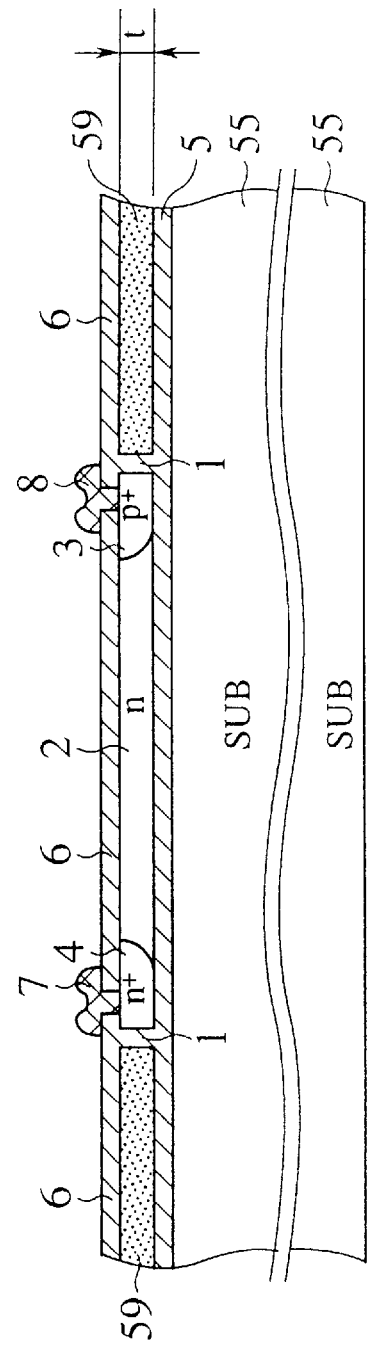
FIG. 5 is a cross sectional view of a conventional diode using an SOI substrate.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(1st Embodiment)

Figure 6:
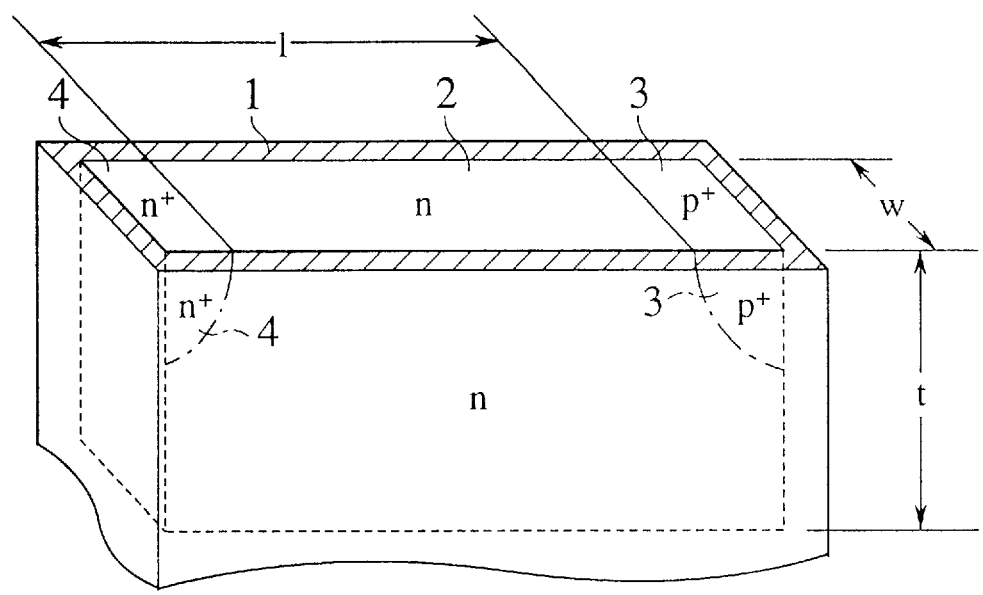
FIG. 6 is a birds eye biew of a P$^+$nn$^+$ diode according to a first embodiment of the invention.
Figure 7A:
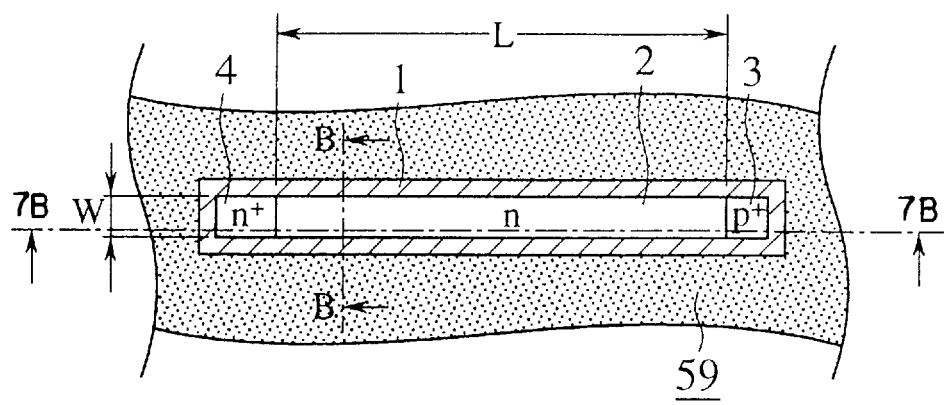
FIG. 7A is a top view of the p$^+$nn$^+$ diode shown in FIG. 6.
Figure 7B:
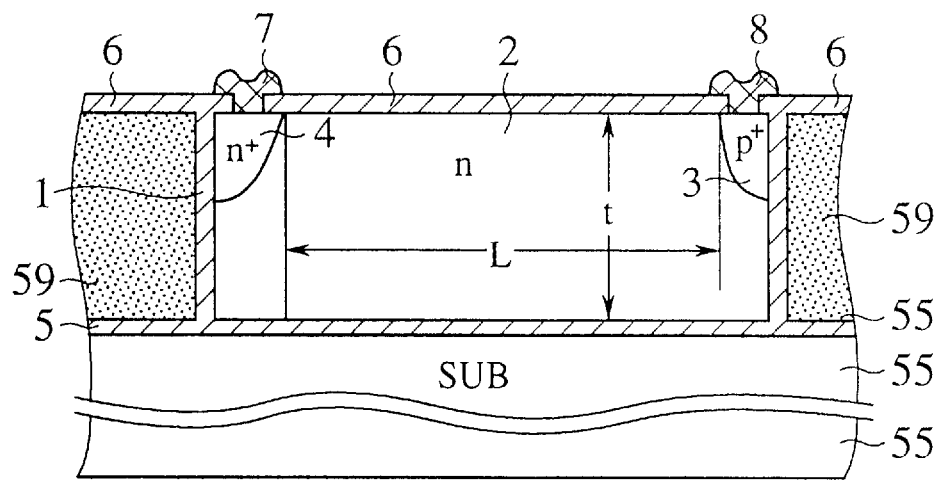
FIG. 7B is a cross sectional view as viewed in the A—A direction of FIG. 7A.
Figure 7C:
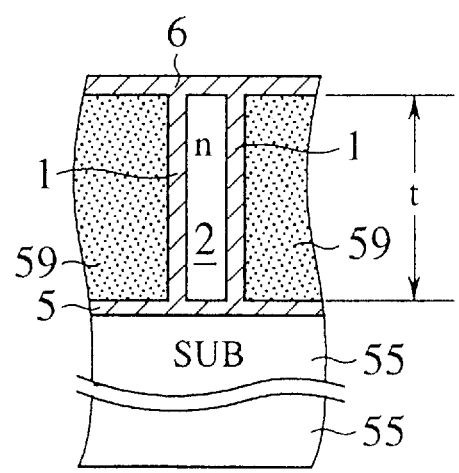
FIG. 7C is a cross sectional view as viewed from the B—B direction of FIG. 7A.

FIG. 6 is a birds eye view of a p⁺nn⁺ diode according to the first embodiment of the invention. FIG. 7A is a top view of the p⁺nn⁺ diode shown in the FIG. 6, FIG. 7B is a cross sectional view as viewed in the A—A direction of FIG. 7A, and FIG. 7C is a cross sectional view as viewed in the B—B direction of FIG. 7A. As seen from FIGS. 7B and 7C, the p⁺nn⁺ diode of the first embodiment of the invention uses an SOI substrate including silicon substrate 55, an SOI oxide film 5 and an active region 2 having a top, a bottom and four side surfaces, formed on the SOI oxide film 5. The SOI oxide film 5 is formed on the silicon substrate 55. DI technique is used for element isolation by forming a deep trench having a side wall generally vertical to the top surface of the SOI substrate, the deep trench reaching the SOI oxide film 5 or bottom insulating film. The thickness t of the active region 2, which is an n-type semiconductor layer 2, is 5 $\mu$m to 20 $\mu$m. The SOI substrate having the active region 2 of such a thickness can be formed easily by the SDB method, with sufficient work accuracy. An SOI substrate made by the SDB method ensures a high breakdown voltage compared with the device formed in the oxygen implanted SIMOX-SOI substrate. Although the structure other than the bottom insulating film 5 and trench side wall insulating film 1 is omitted in FIG. 6, a silicon substrate 55, a bottom insulating film 5, and an n-type semiconductor layer 2 as an active region respectively constituting the SOI substrate are shown in FIGS. 7B and 7C. As seen from FIG. 7B, in the n-type semiconductor layer 2, an n⁺-type cathode diffusion region 4 and a p⁺-type anode diffusion region 3 are formed. An insulating film 6 such as SiO₂ is formed on the top surface of the n-type semiconductor layer 2. Via contact holes (contact windows) formed in the insulating film 6, the n⁺-type cathode diffusion region 4 and p⁺-type anode diffusion region 3 are respectively connected to a metal cathode electrode 7 and a metal anode electrode 8. For the simplicity of drawings, the metal cathode electrode 7 and metal anode electrode 8 are omitted in the birds eye view of FIG. 6 and in the plan view of FIG. 7A. Outside of the trench side wall insulating film 1 disposed at the peripheral areas of the n-type semiconductor layer 2, an element isolation trench burying member 59 such as non-doped polysilicon (NDPOS) is formed. Instead of NDPOS, oxygen doped polysilicon, i.e., semi-insulating poly-silicon (SIPOS), may also be used. The feature of the first embodiment of the invention shown in FIGS. 6, 7A, 7B, and 7C resides in that the width W between a pair of trench side wall insulating films 1 along current path is set to 5 $\mu$m or narrower. It is difficult to form a thin film in the thickness t direction of the substrate without reducing the breakdown voltage because of crystal quality or mechanical strength. Therefore, the width W of the active region 2 is narrowed in the direction vertical to the thickness t direction, i.e., in the lateral direction. Specifically, the feature of the first embodiment of the invention resides in that as shown in FIGS. 6, 7A, 7B, and 7C, the width W between a pair of trench side wall insulating films along current path is set narrower, relative to the distance L between the electrodes and the thickness t of the active region. With this structure, an effective volume of a semiconductor device such as a diode can be suppressed to be small. Therefore, the reverse recovery charge $Q_{rr}$ of a diode can be made small. In the first embodiment of the invention, the width W is set to 1 $\mu$m. If the width W is set to 5 $\mu$m or narrower, the reverse recovery charge $Q_{rr}$ can be made small. Therefore, a width of 5 $\mu$m or narrower can be selected as desired depending on process techniques such as constraints on photolithography, current capacity, and the like. If a large current device requiring 50 A to 100 A or 1000 A or higher is to be formed, a multi-channel structure is used which uses elements, or unit-cells with W=5 $\mu$m connected in parallel. A trench having a vertical side wall of 5 to 20 $\mu$m thick can be formed easily by reactive ion etching (RIE) using CF₄ +O₂, SF₆ +O₂, SiCl₄, or CCl₄, or electron cyclotron resonance (ECR) ion etching. If the substrate is cooled to −5° C. to −196° C. when the trench is etched by RIE, trench having a high aspect ratio and a depth of 5 to 20 $\mu$m can be formed.

(2nd Embodiment)

Figure 8:
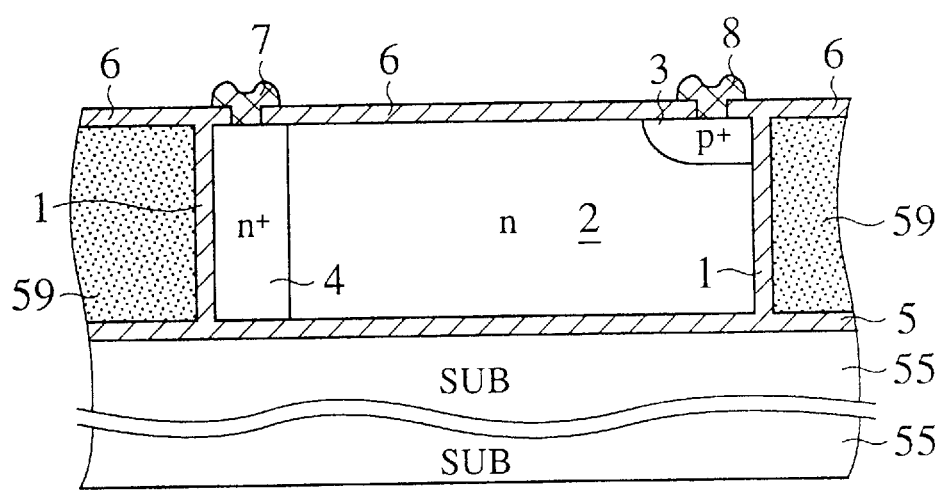
FIG. 8 is a cross sectional view of a p$^+$nn$^+$ diode according to a second embodiment of the invention.

FIG. 8 illustrates the second embodiment of the invention in which an n⁺-type cathode diffusion region 4 is formed reaching a bottom insulating film 5. If the thickness t of the n-type semiconductor layer 2 or active region is about 5 $\mu$m, it is relatively easy to diffuse impurity ions such as phosphorous (P) about 5 $\mu$m thick from the top surface of the n-type semiconductor layer 2. However, if the thickness t is 20 $\mu$m, diffusion is required to be performed at a high temperature of 1150° C. to 1200° C. for a long time, and this thermal treatment during diffusion generates new crystal defects. Deep diffusion is obviously accompanied by unwanted lateral diffusion having a width of 70 to 80% of the vertical diffusion depth. Therefore, it becomes difficult to make a fine structure, and an on-voltage per unit chip area becomes high. A long time required for diffusion is disadvantageous from the viewpoint of production cost. For the above reasons, by diffusing impurity ions not from the top surface of the substrate but from the trench side wall or from the side surface in the lateral direction, the $n^+$-type cathode diffusion region 4 is formed. Specifically, the structure of the second embodiment of the invention is formed by the following method.

Figure 9A:
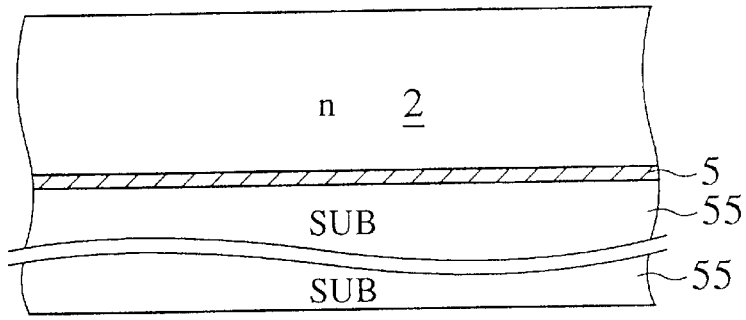
FIG. 9A to 9D are cross sectional views illustrating the processes of a method of manufacturing the p⁺nn⁺ diode of the second embodiment according to the present invention.

(a) As shown in FIG. 9A, an n-type semiconductor layer 2 is formed on a bottom insulating film 5 on a semiconductor substrate 55, by the SDB method.

Figure 9B:
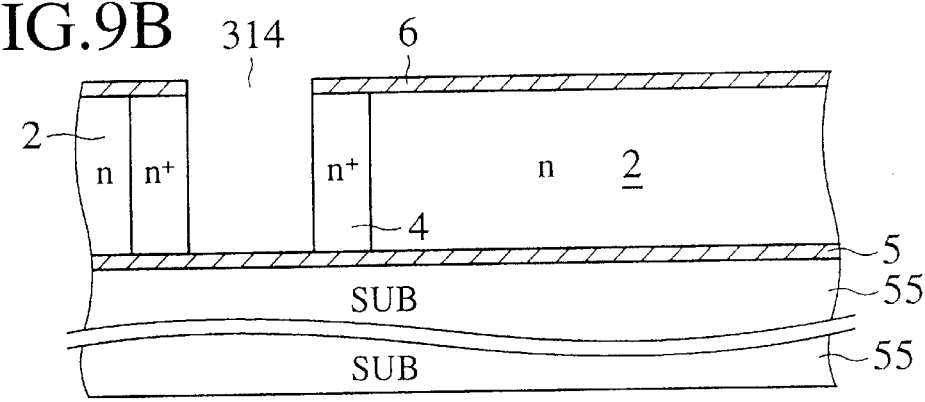

(b) As shown in FIG. 9B, a first element isolation groove (trench) 314 is formed from the surface of the n-type semiconductor layer 2 at the left side in FIG. 9B, the trench 314 having a side wall substantially vertical to the top surface of the semiconductor layer 2. It is preferable to form the first trench 314 by using an oxide film mask formed on the top surface of the semiconductor layer 2. Namely, prior to forming the first element isolation groove 314, an oxide film 6 is formed on the top surface of the n-type semiconductor layer 2, and patterned to form a trench forming mask. By using this mask of the oxide film 6, RIE is performed to form the groove 314.

(c) As shown in FIG. 9B, n-type impurities are diffused from the side wall of the first element isolation groove 314 by using $POCl_3$ or $AsCl_3$ to form the $n^+$-type cathode diffusion region 4. For example, $POCl_3$ is deposited for 30 minutes at a temperature of 1050° C. by using mixed gas of $O_2+N_2$. After the deposited phosphosilicate glass (PSG) film due to $POCl_3$ is removed, diffusion in the lateral direction is performed through "drive-in process" at a temperature of 1050° C. for 30 minutes.

Figure 9C:
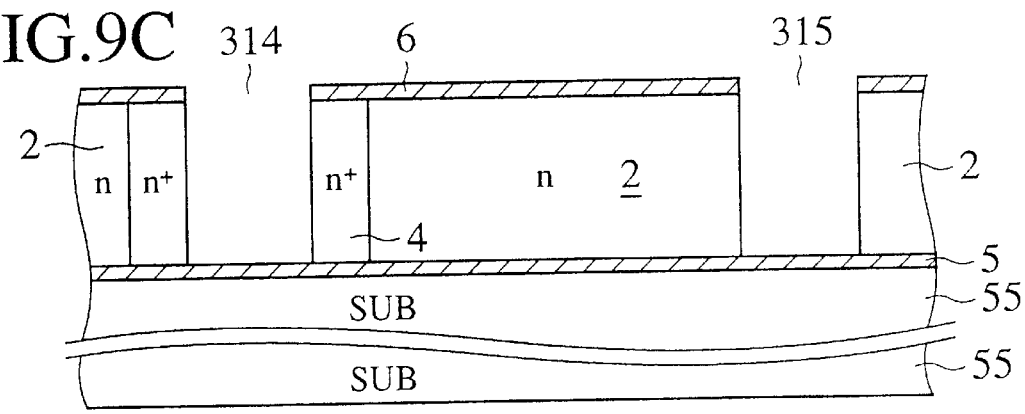

(d) Next, as shown in FIG. 9C, a second element isolation groove (trench) 315 is formed and thereafter, third and fourth element isolation grooves in the direction perpendicular to the first and second element isolation grooves are formed to surround the semiconductor layer 2 by these first to fourth element isolation grooves. Namely, the semiconductor layer 2 is surrounded by four side surfaces. The first to fourth element isolation grooves may be formed at the same time through RIE or other processes.

Figure 9D:
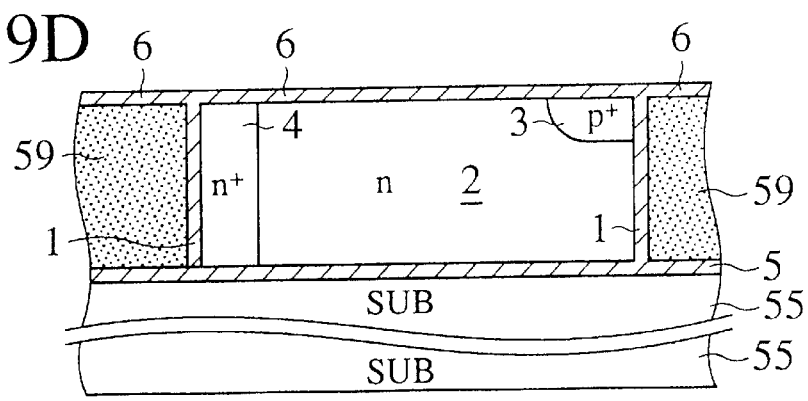

(e) As shown in FIG. 9D, on the side walls of the first to fourth element isolation grooves or on the side surface of the semiconductor layer 2, an element isolation insulating film 1 is formed, and the first to fourth element isolation grooves are filled with an element isolation trench burying member 59 such as polysilicon.

(f) As shown in FIG. 9D, a diffusion window is formed in the oxide film 6 on the top surface of the semiconductor layer 2 at a predetermined position, and p-type impurities ions such as boron (B) are diffused via the diffusion window to form a $p^+$-type anode diffusion region 3.

With the processes (a) to (f) described above, the structure shown in FIG. 8 can be realized easily.

Figure 10:
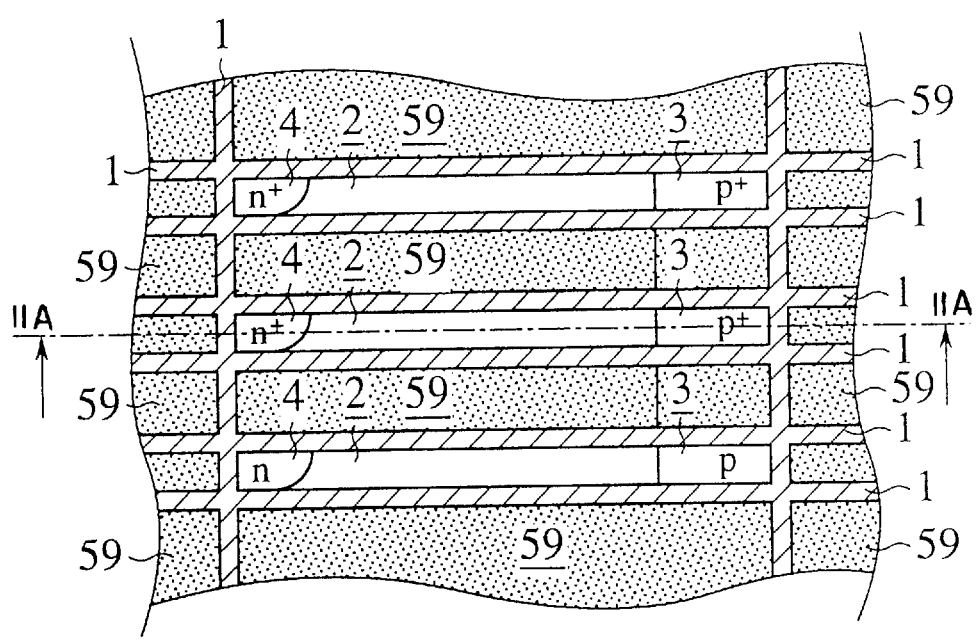
FIG. 10 is a plan view of a high power device having a number of juxtaposed p⁺nn⁺ diodes of the second embodiment according to the present invention.

The $n^+$-type cathode diffusion region of the second embodiment may be formed by the following processes, while positively using the feature of this invention that the width W is narrow. Specifically, first, the first and second element isolation grooves and the third and fourth element isolation grooves perpendicular to the former grooves are formed. Next, an oxide film is formed on the side walls of the first to fourth element isolation grooves. Part of the oxide film on the side wall of the third or fourth element isolation groove is removed through etching having high directivity such as ECR ion etching, to thereby form a diffusion window. From this diffusion window, phosphorous (P) is diffused laterally from the side wall of the third or fourth element isolation groove by using $POCl_3$ or the like. In this manner, a deep $n^+$-type cathode diffusion region reaching the bottom insulating film 5 can be formed at a low temperature and in a short time. In this case, an oxide film is formed on the diffusion window during the impurity diffusion process by using an oxygen atmosphere, or it may be formed on the diffusion window after the diffusion process by performing a thermal treatment in inert gas such as $N_2$ and Ar. Thereafter, the element isolation grooves or trenches are filled by depositing NDPOS 59 through low pressure CVD (LPCVD) to complete the structure shown in FIG. 8. Instead of NDPOS, SIPOS added with oxygen of 10% to 50% may be used. The structure shown in FIG. 8 is easy to realize a so-called multi-channel structure. For example, as shown in FIG. 10, 1000 $n^+np^+$ diodes with W=1 $\mu$m may be connected in parallel. FIG. 8 correspond to a cross sectional view as viewed from the A—A direction of FIG. 10. A diode is therefore possible which has a small reverse recovery charge $Q_{rr}$ and a high speed turn-off, and it can flow large current.

(3rd Embodiment)

FIGS. 11A and 11B illustrate the third embodiment of the invention in which both an $n^+$-type cathode diffusion region 4 and a $p^+$-type anode diffusion region 4 are formed by lateral diffusion from the trench side walls, reaching a bottom insulating film 5. With the structure shown in FIG. 8, since the $p^+$-type anode diffusion region 3 is formed only near the surface of the n-type semiconductor layer 2, some regions will not contribute to the effective volume of a main current path of a diode operation. With the structure shown in FIG. 11A, no surplus volume in which excessive carriers are accumulated is formed so that the reverse recovery charge $Q_{rr}$ can be made small and so a high speed turn-off is possible. FIG. 11A is a cross sectional view as viewed from the A—A direction of FIG. 11B. FIG. 11A is a partial view of $p^+nn^+$ diodes disposed in a lateral direction with the element isolation grooves being interposed therebetween. Namely, on the right side of FIGS. 11A and 11B, the $n^+$-type cathode diffusion region 4 to be serially connected to the next stage is shown. The serially connected penny diodes constitute a high breakdown voltage, and high speed switching diode. Lateral diffusion for forming the $p^+$-type anode diffusion region 3 may be performed through a side wall of the element isolation groove by using $BBr_3$ gas source or BN solid source.

The structure of the third embodiment of the invention can be manufactured easily by the following method.

Figure 12A:
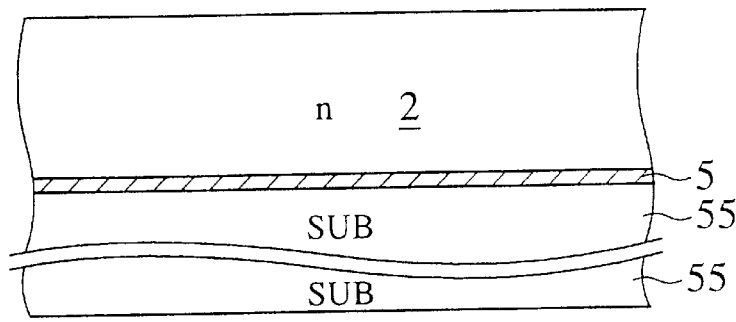
FIG. 12A to 12D are cross sectional views illustrating the processes of a method of manufacturing the p⁺nn⁺ diode of the third embodiment according to the present invention.

(a) As shown in FIG. 12A, an n-type semiconductor layer 2 is formed on a bottom insulating film 5 on a semiconductor substrate 55, by the SDB method.

Figure 12B:
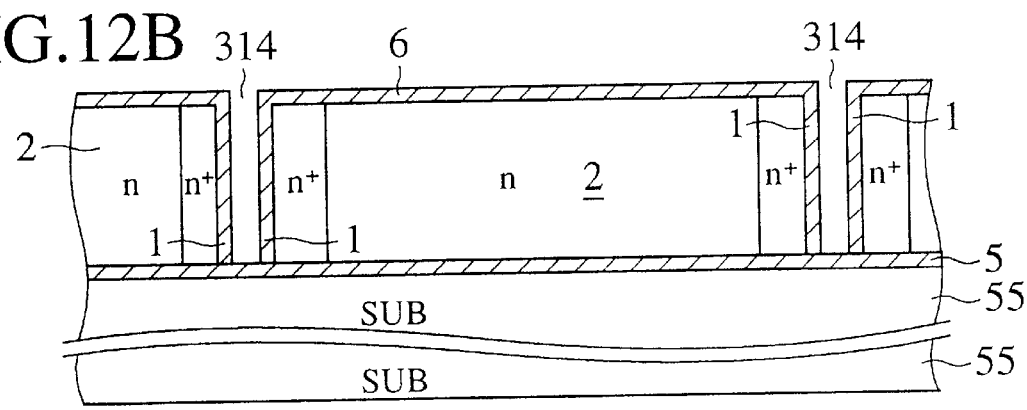

(b) As shown in FIG. 12B, a first trench 314 is formed from the top surface of the n-type semiconductor layer 2, the trench 314 having a side wall substantially vertical to the top surface of the semiconductor layer 2. By using $POCl_3$ or the like, $n^+$-type impurities are diffused from the side wall of the first trench 314 to form an $n^+$-type cathode region 4. Thereafter, an element isolation insulating film 1 is formed on the surface of the first trench. From the side wall of the trench 314 on the right side of FIG. 12B, the $n^+$-type cathode region 4 at the next stage is formed by diffusion. The first trench 314 may be formed by ECR ion etching, RIE, or other processes by using as a mask an insulating film 6 formed on the top surface of the n-type semiconductor layer 2.

Figure 12C:
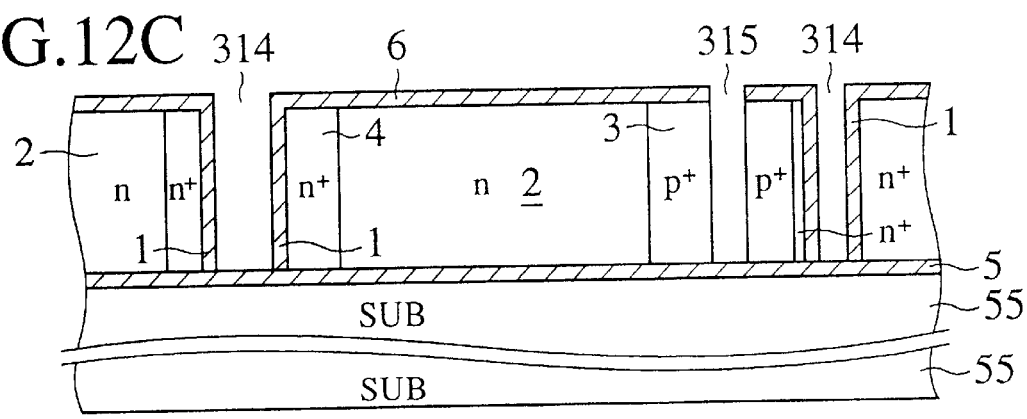
Figure 12D:
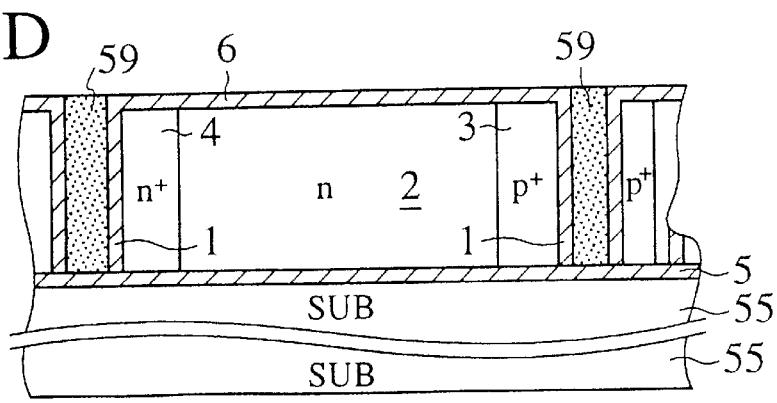

(c) As shown in FIG. 12C, a second trench 315 is formed from the top surface of the n-type semiconductor layer 2, the trench 314 having a side wall substantially vertical to the top surface of the semiconductor layer 2. The second trench 315 is spaced apart from the first trench 314 by a predetermined distance. By using $BBr_3$ or the like, $p^+$-type impurities are diffused from the side wall of the second trench 315 to form a $p^+$-type anode region 3. For example, $BBr_3$ is deposited for 30 minutes at a temperature of 950° C. to 1000° C. After the deposited borosilicate glass (BSG) film, which is formed during the $BBr_3$ deposition process, is removed, "drive-in process" is performed at a temperature of 1100° C. for 15 minutes. On the surface of the inner wall of the second trench, an element isolation insulating film 1 such as $SiO_2$ is formed.

(d) Next, as shown in FIG. 11B, third and fourth trenches are formed continuously with, and perpendicular to, the first and second trenches 314 and 315 to surround the n-type semiconductor region by these first to fourth trenches.

(e) On the surfaces of the third and fourth trenches, an element isolation insulating film 1 such as $SiO_2$ is formed. Thereafter, the first to fourth trenches are filled with an element isolation trench burying member 59 such as polysilicon.

(f) The insulating film 6 on the top surface of the n-type semiconductor layer 2 previously formed for the trench forming-mask is removed to expose the top surface of the n-type semiconductor layer 2, and a surface insulating film 6 is again formed on the top surface of the n-type semiconductor layer 2 and on the top surface of the element isolation trench burying member 59. Contact holes for the $n^+$-type cathode region 4 and $p^+$-type anode region 3 are formed in the surface insulating layer 6 at predetermined positions. Thereafter, a metal thin film such as Al and Al—Si is vacuum-evaporated and patterned by photolithography to form a cathode electrode 7 and an anode electrode 8 such as shown in FIG. 11A.

The method of the third embodiment of the invention can manufacture a diode structure very easily. Therefore, crystal defects are not formed during the manufacture processes and semiconductor devices of high speed and high breakdown voltage can be realized. It can be understood easily that if diodes are not serially connected, the trenches 314 and 315 are not required to be formed side by side like those shown in FIG. 12C.

According to the third embodiment of the invention, the deep $n^+$-type cathode diffusion region 4 and $p^+$-type anode diffusion region 5 allow to set the channel width along the substrate thickness direction and to make a fine pattern layout in plan. Therefore, an effective channel area increases, an on-resistance $R_{ON}$ per chip area can be reduced, and the turn-off time $\tau_{OFF}$ can be shortened. An $R_{ON}$-$\tau_{OFF}$ tradeoff curve shifts towards a smaller value side, allowing high speed and low loss switching.

(4th Embodiment)

Figure 13:
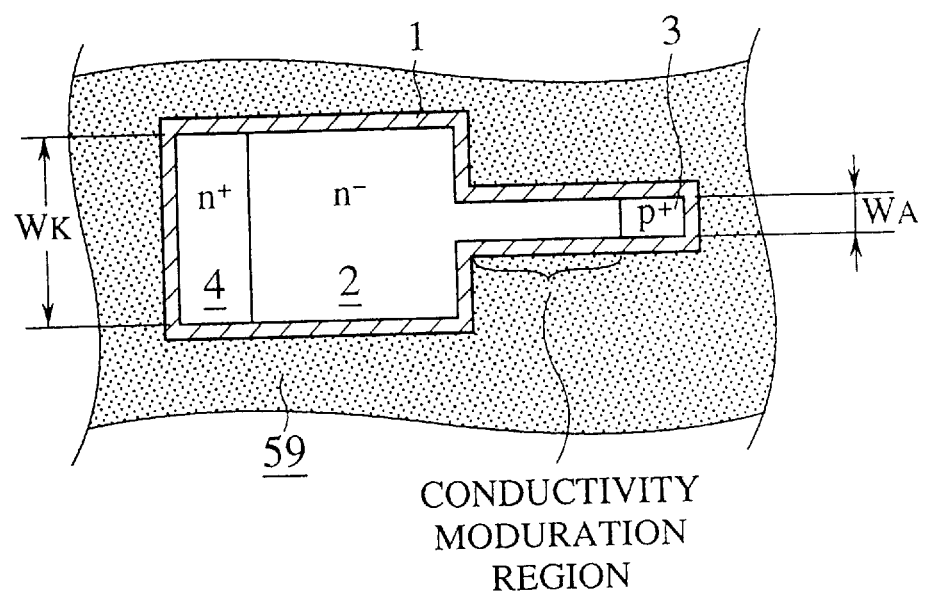
FIG. 13 is a plan view of a p⁺nn⁺ diode according to a fourth embodiment of the invention.

FIG. 13 is a top view of a diode according to the fourth embodiment of the invention. The cross sectional view thereof is the same as the first to third embodiments, and so it is omitted. An $n^-$-type semiconductor layer 2 having a top, a bottom and eight side surfaces is formed on a SOI oxide film. For the simplicity of the drawing, the top view-of FIG. 13 omits the cathode electrode 7, anode electrode 8, metal wiring patterns connected the electrodes, bonding pads, and the like.

In the fourth embodiment of the invention, The width $W_K$ between the element isolation grooves on the $n^+$-type diffusion region 4 side is set to 8 $\mu$m, and the width $W_A$ on the $p^+$-type anode diffusion region 3 side is set to 2 $\mu$m. Only the width $W_A$ on the $p^+$-type anode diffusion region 3 side is made narrow because carriers in the $n^-$-type semiconductor layer 2 in front of the $p^+$-type anode diffusion region 3 contribute to the reverse recovery charge $Q_{rr}$ associated with the turn-off time of the diode.

$W_A$=2 $\mu$m is only illustrative, and if $W_A$<5 $\mu$m, then $Q_{rr}$ becomes small and high speed turn-off is possible. Instead of the $n^-$-type semiconductor layer, an i-type semiconductor layer having an impurity concentration of $5 \times 10^{11}$ to $2 \times 10^{12} cm^{-3}$ may be used. Since the area on the $n^+$-type cathode diffusion region 4 side is broader than the area in front of the $p^+$-type anode diffusion region 3, an effective injection efficiency of electrons from the $n^+$-type cathode diffusion region 4 increases and the turn-off time is shortened. Although a low on-resistance and high speed switching are in a tradeoff relation, the embodiment of the invention allows the tradeoff curve of on-resistance $R_{ON}$ and turn-off time $\tau_{OFF}$ to shift toward a small value side.

(5th Embodiment)

Figure 14A:
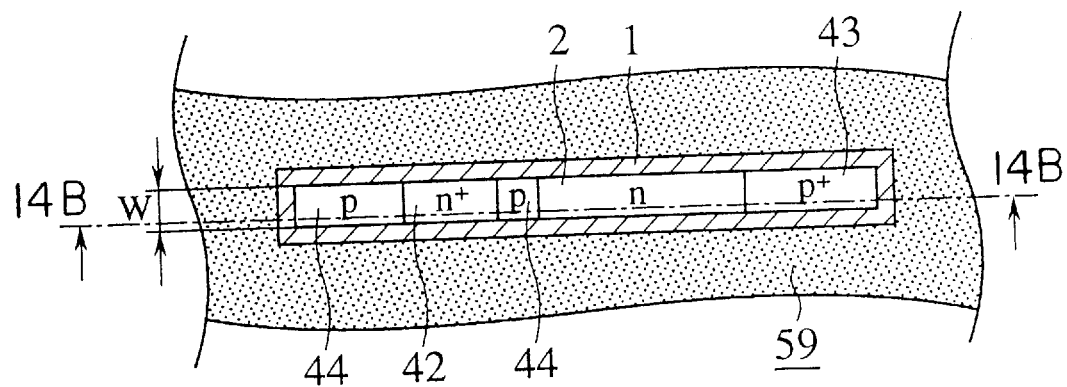
FIG. 14A is a plan view of an IGBT according to a fifth embodiment of the invention.
Figure 14B:
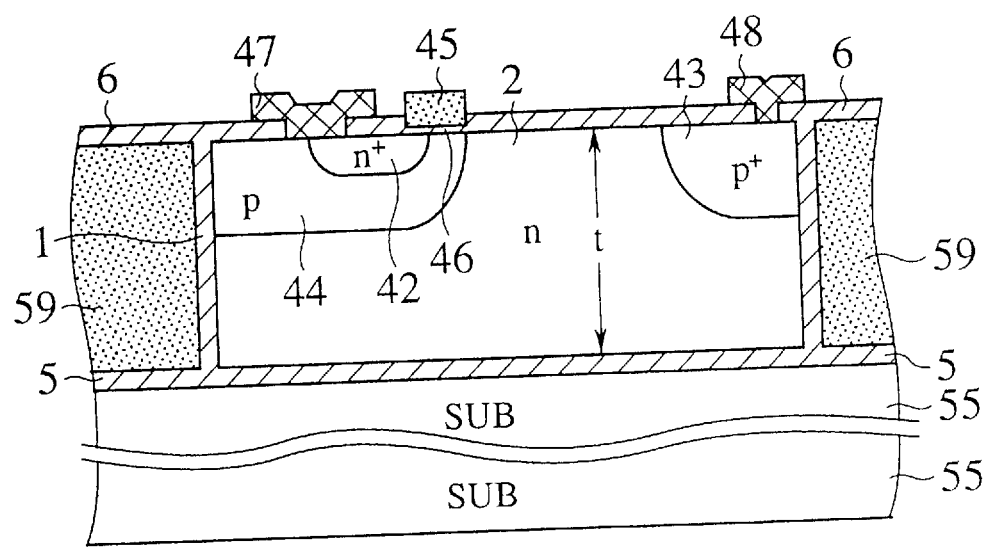
FIG. 14B is a cross sectional view of IGBT of the fifth embodiment.

FIG. 14A is a top view of an IGBT according to the fifth embodiment of the invention, and FIG. 14B is across sectional view as viewed from the A—A direction of FIG. 14A. The IGBT shown in FIGS. 14A and 14B has an SOI substrate in which an n-type semiconductor layer 2 is formed on a bottom insulating film 5 formed on an Si substrate 55. The n-type semiconductor layer 2 having a top, a bottom and four side surfaces. The n-type semiconductor layer 2 has a thickness t of 15 $\mu$m and a width W of 2 $\mu$m. A p-type base region 44 is formed in the surface region of the n-type semiconductor layer 2, and an $n^+$-type emitter region 42 is formed in the p-type base region 44. On the top surface of the p-type base region 44, a gate electrode 45 made of doped polysilicon (DOPOS) is formed with a gate insulating film 46 of 70 nm thick being interposed therebetween. An emitter metal electrode 47 is formed in contact with both the $n^+$-type emitter region 42 and p-type base region 44. A $p^+$-type collector region 43 is formed in a partial area of the surface of the n-type semiconductor layer 2, and a collector metal electrode 48 is formed in contact with the surface of the $p^+$-type collector region 43. For the simplicity of the drawing, the emitter metal electrode 47, collector metal electrode 48, and gate electrode 45 are omitted in FIG. 14A. As seen from FIG. 14B, an insulating film 6 of $SiO_2$ is formed on the top surface of the n-type semiconductor layer 2 to a thickness of 350 nm. Via contact holes formed in this insulating film 6, the emitter metal electrode 47 and collector metal electrode 48 are connected to the corresponding active regions.

The outside of a trench side wall insulating film 1 of 300 nm thick formed on the side surface of the n-type semiconductor layer 2 is filled with an element isolation trench burying member 59 of NDPOS. Instead of NDPOS, polysilicon with additive oxygen, i.e., SIPOS, may be used.

As shown in FIGS. 14A and 14B, the feature of the fifth embodiment of the invention resides in that the width W between a pair of trench side wall insulating films along a current path is set smaller than the thickness t of the active region. This structure can suppress the effective volume of the active region of IGBT to be small. It is therefore possible to shorten the fall time of the IGBT without incorporating particular lifetime control technique. Although W=5 μm is used in the fifth embodiment of the invention, this width may have a desired value if it is 5 μm or narrower which ensures a shortened fall time, while taking into account process techniques such as etching technique and photolithography, and a current handling capability. For a large current device of 100 A or 1000 A or larger, the multi-channel structure is used in which unit-cells with W=5 μm or narrower are connected in parallel. The thickness t of the active layer is selected from values in the range from 5 to 20 μm, in accordance with application fields. The trench of 5 to 20 μm deep having a vertical side wall can be formed easily through RIE using $SF_6+O_2$, $CCl_4$, or the like, or through ECR ion etching, similar to the first embodiment of the invention.

(6th Embodiment)

Figure 15A:
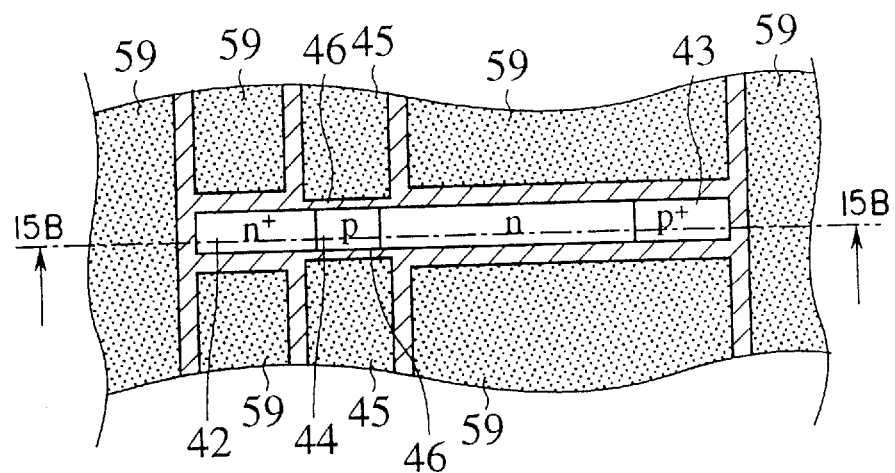
FIG. 15A is a plan view of an IGBT according to a sixth embodiment of the invention.
Figure 15B:
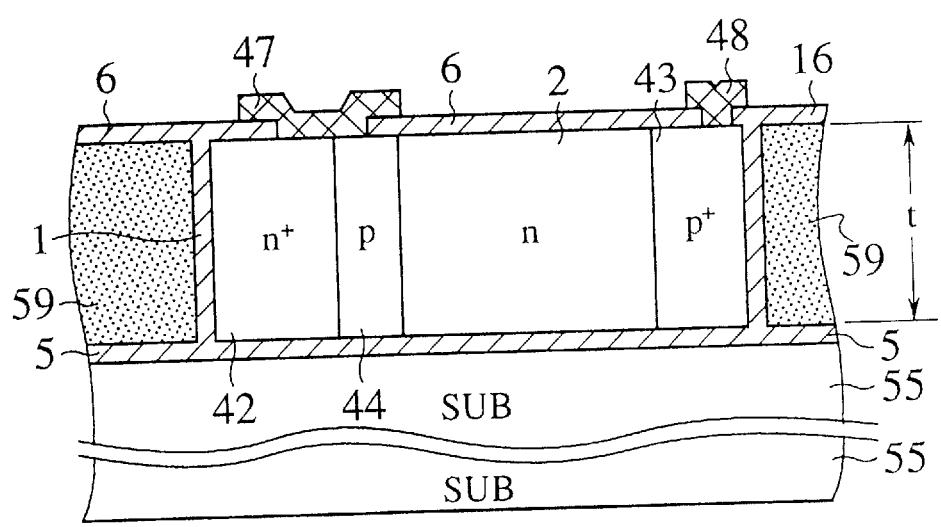
FIG. 15B is a cross sectional view of IGBT of the sixth embodiment.

FIG. 15A is a top view of an IGBT according to the sixth embodiment of the invention, and FIG. 15B is a cross sectional view as viewed from the A—A direction of FIG. 15A. The IGBT shown in FIGS. 15A and 15B has an SOI substrate in which an n-type semiconductor layer 2 is formed on a bottom insulating film 5 formed on an Si substrate 55. The n-type semiconductor layer 2 has a top, a bottom and four side surfaces. The n-type semiconductor layer 2 has a thickness t of 20 μm and a width W of 1.5 μm. On the left side of the n-type semiconductor layer 2, an $n^+$type emitter region 42 and a p-type base region 44 are formed reaching the bottom insulating film 5. On the right side of the n-type semiconductor layer 2, a $p^+$-type collector region 43 is formed reaching the bottom insulating film 5 starting from the top surface of the n-type semiconductor layer 2. The $n^+$-type emitter region 42 and p-type base region 44 are formed by double diffusion of boron (B) and phosphorous (P) from the left side surface of the n-type semiconductor layer 2. The $p^+$-type collector region 43 is formed by diffusion of boron (B) from the right side surface of the n-type semiconductor layer 2. As shown in FIG. 15A the p-type base region having a common side surface to the side surface of the n-type semiconductor layer 2. On the common side surface of the p-type base region 44, a gate oxide film 46 of 100 nm thick is formed. And on the gate oxide film 46, a gate electrode 45 of DOPOS is formed to bury the trench facing to the common side surface. An emitter metal electrode 47 is formed in contact with both the top surfaces of the $n^+$-type emitter region 42 and p-type base region 44. A collector metal electrode 48 is formed in contact with the top surface of the $p^+$-type collector region 43. For the simplicity of the drawing, the emitter metal electrode 47, collector metal electrode 48, and gate electrode 45 are omitted in FIG. 15A. As seen from FIG. 15B, an insulating film 6 of $SiO_2$ is formed on the surface of the n-type semiconductor layer 2 to a thickness of 350 nm. Via contact holes formed in this insulating film 6, the emitter metal electrode 47 and collector metal electrode 48 are connected to the corresponding active regions. The outside of a trench side wall insulating film 1 of 300 nm thick formed on the side surface of the n-type semiconductor layer 2 is filled with an element isolation trench burying member 59 of NDPOS. Instead of NDPOS, polysilicon with additive oxygen, i.e., SIPOS, may be used.

As shown in FIGS. 15A and 15B, the feature of the sixth embodiment of the invention resides in that the width W between a pair of trench side wall insulating films along a current path is set smaller than the thickness t of the active region. This structure can suppress the effective volume of the active region of IGBT to be small. It is therefore possible to shorten the fall time of the IGBT without incorporating particular lifetime control technique. Although W=1.5 μm is used in the sixth embodiment of the invention, this width may have a desired value if it is 5 μm or narrower which ensures a shortened fall time, while taking into account fine process techniques such as photolithography, and a current handling capability. For a large current device of 1000 A or larger, the multi-channel structure is used in which unit-cells with W=5 μm or narrower are connected in parallel. The thickness t of the active layer is selected from values in the range from 5 to 20 μm. The trench of 5 to 20 μm deep having a vertical side wall can be formed easily through RIE or through ECR ion etching, similar to the first embodiment of the invention. The size and the like used in the embodiment of the invention are only illustrative, and they can be selected as desired so long as they satisfy the scope of the invention.

According to the sixth embodiment of the invention, the $n^+$-type emitter diffusion region 42 and $p^+$-type collector diffusion region 43 are formed deeply so that main current can be distributed in the depth direction from the top surface of the semiconductor chip, i.e., the channel width can be selected in the depth direction independently from the limited area of the top surface and the fine pattern layout in plan. Accordingly, the effective channel area increases, the on-resistance $R_{ON}$ per chip area reduces, and the turn-off time $\tau_{OFF}$ is shortened. The $R_{ON}$-$\tau_{OFF}$ tradeoff curve can be therefore shifted to a small value side, allowing high speed and low loss switching. In addition to a low on-resistance $R_{ON}$ due to dispensing with lifetime control technique, an increased channel area not restricted by the total surface of the semiconductor chip further reduces the on-resistance $R_{ON}$.

(7th Embodiment)

Figure 16A:
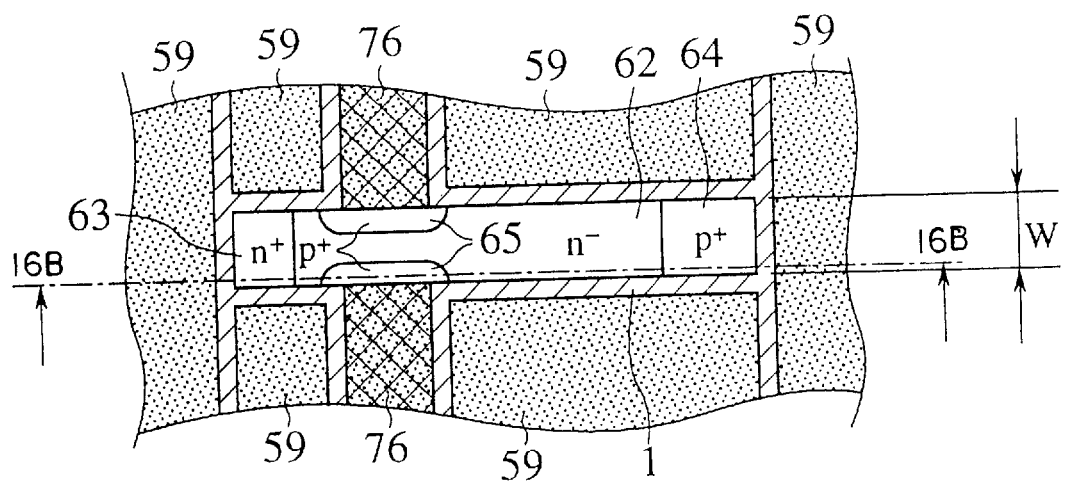
FIG. 16A is a plan view of an SI thyristor according to a seventh embodiment of the invention.
Figure 16B:
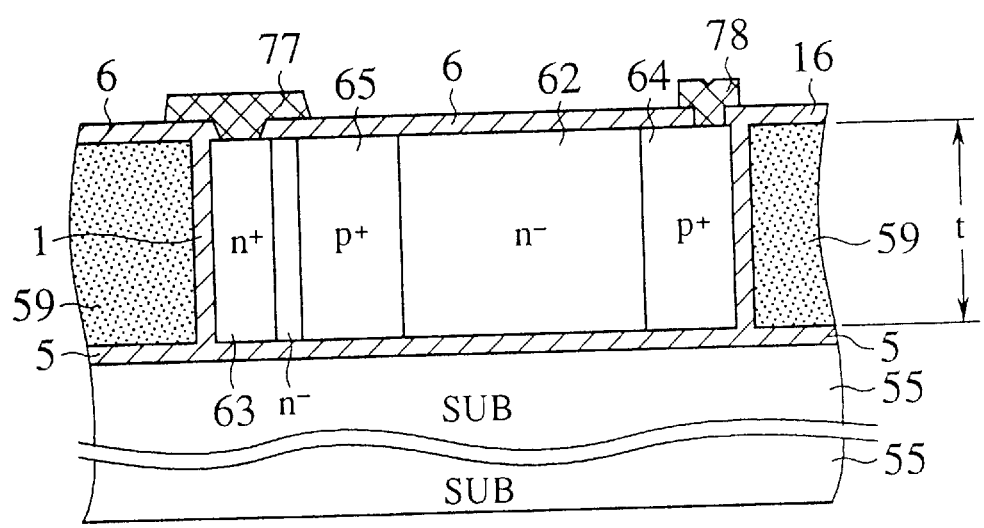
FIG. 16B is a cross sectional view of the SI thyristor of the seventh embodiment.

FIG. 16A is a top view of a static induction (SI) thyristor according to the seventh embodiment of the invention, and FIG. 16B is a cross sectional view as viewed from the A—A direction of FIG. 16A. The SI thyristor shown in FIGS. 16A and 16B has an SOI substrate in which an $n^-$-type semiconductor layer 62 having an impurity concentration of $10^{12}$ to $10^{15} cm^{-3}$ is formed on a bottom insulating film 5 formed on an Si substrate 55. The $n^-$-type semiconductor layer 62 has a top, a bottom and four side surfaces. The n-type semiconductor layer 62 has a thickness t of 15 μm and a width W of 2 μm at the position sandwiched between side wall insulating films 1. Sandwiching the $n^-$-type semiconductor layer 62, a pair of $p^+$-type gate regions 65 are formed. The $p^+$-type gate region 65 having a common side surface to the side surface of the $n^-$-type semiconductor layer 62. On the left side of the $n^-$-type semiconductor layer 62, an $n^+$-type cathode region 63 is formed. A gate electrode 76 of $p^+$-doped polysilicon (p+DOPOS) providing good ohmic contact to the $p^+$-type gate region 65 is formed on the common side surface of the $p^+$-type gate regions 65. The diffusion depth of the $p^-$-type gate region is about 0.5 μm as measured from the common side surface thereof in the lateral direction (in horizontal direction). The $p^+$-type gate region 65 is formed by lateral diffusion of impurities from a diffusion window at the common side surface or the side wall of the trench used for forming $p^+$ DOPOS 76. A cathode metal electrode 77 is formed in contact with the top surface of the $n^+$-type cathode region 63. On the right side of the $n^-$-type semiconductor layer 2, a $p^+$-type anode region 64 is formed, and an anode metal electrode 78 is formed on the top surface of the $p^+$-type anode region. For the simplicity of the drawing, the cathode metal electrode 77 and anode metal electrode 78 are omitted in FIG. 16A.

In the SI thyristor shown in FIGS. 16A and 16B, depletion layers extending from the $p^+$-type gate regions 65 pinch off the channel in front of the n⁺-type cathode region 63 at a zero gate bias. In other words, a potential barrier is formed in front of the n⁺-type cathode region 63. When a positive potential is applied to the gate electrode 76 relative to the cathode metal electrode 77, the potential barrier formed in the n⁻-type semiconductor layer 2 sandwiched between the paired p⁺-type gate regions 65 lowers, so that electrons are injected from the n⁺-type cathode region 63 into the n⁻-type semiconductor layer 62 on the p⁺-type anode region 64 side. The injected electrons are accumulated in the area in front of the p⁺-type anode region 64 to enhance the injection of holes from the p⁺-type anode region 64, the injected holes further lower the potential barrier in front of the n⁺-type cathode region, and electrons are therefore injected further from the n⁺-type cathode region to eventually turn on the Si thyristor. When the negative potential is applied to the gate electrode 76, the potential barrier in front of the n⁺-type cathode region rises and the SI thyristor is turned off.

As shown in FIGS. 16A and 16B, the feature of the seventh embodiment of the invention resides in that the width W between a pair of trench side wall insulating films along a current path is set smaller than the thickness t of the active region. This structure can suppress the effective volume of the active region of the SI thyristor to be small. It is therefore possible to shorten the fall time of the SI thyristor without incorporating particular lifetime control technique. In the seventh embodiment of the invention, it is preferable to set the width W to about 1.5 $\mu$ to about 5 m$\mu$. With a narrow width W, the fall time can be shortened. Specifically, the width W may have a desired value if it is 5 $\mu$m or narrower, while taking into account other process techniques and a current capacity. For a large current device of 1000 A or larger, the multi-channel structure is used in which unit-cells with W=5 $\mu$m or narrower are connected in parallel. The thickness t of the active layer is selected from values in the range from 5 to 20 $\mu$m, or may be set thicker. The trench of 5 to 20 $\mu$m deep having a vertical side wall can be formed easily through RIE or through ECR ion etching, similar to the first embodiment of the invention. The size and the like used in the embodiment of the invention are only illustrative, and they can be selected as desired so long as they satisfy the scope of the invention.

According to the seventh embodiment of the invention, the n⁺-type cathode diffusion region 63 and p⁺-type anode. diffusion region 43 are formed deeply so that the effective channel width can be set in the depth direction of the substrate, without being restricted by the surface area of the semiconductor chip and pattern layout in plan can be made fine. Accordingly, the effective channel area increases, the on-resistance $R_{ON}$ per chip area reduces, and the turn-off time $\tau_{OFF}$ is shortened. The $R_{ON}$-$\tau_{OFF}$ tradeoff curve can be therefore shifted to a small value side, allowing high speed and low loss switching. By superimposing the effect of the increased channel area, the low on resistance characteristics due to high crystal quality ascribable to the fact that lifetime control technique is not employed, the on-resistance $R_{ON}$ further reduces and becomes very small. This is because the effective conductivity modulation is caused in the high crystal quality n⁻semiconductor layer 62.

Various modifications will become possible for those skilled in the art after receiving the teachings of the present invention without departing from the-scope thereof.

What is claimed is:

1. A semiconductor power device comprising:
   (a) a substrate;
   (b) a bottom insulating film formed on said substrate;
   (c) a first semiconductor layer of a first conductivity type having a top, a bottom and at least four side surfaces, formed on said bottom insulating film at a partial area thereof;
   (d) an element isolation region facing to said side surfaces and surrounding said first semiconductor layer, said element isolation region having a substantially vertical side wall;
   (e) an element isolation insulating film formed on said side surfaces at an interface between said element isolation region and said first semiconductor layer;
   (f) a first main electrode region of the first conductivity type having a higher impurity concentration than that of the first semiconductor layer, formed in said first semiconductor layer at a partial area thereof; and
   (g) a second main electrode region of a second conductivity type formed in said first semiconductor layer at a partial area thereof, said second main electrode region being spaced apart from said first main electrode region,
   wherein a thickness t of said first semiconductor layer is 5 $\mu$m or thicker, a width W of said first semiconductor layer sandwiched by said element isolation insulating film between said first and second main electrode regions is 5 $\mu$m or narrower, and t>W.

2. A device of claim 1, further comprising:
   a second semiconductor layer of the second conductivity type formed in said first semiconductor layer and enclosing said first main electrode region therein, and having a common top surface to the top surface of said first semiconductor layer.

3. A device of claim 1, further comprising:
   a second semiconductor layer of the second conductivity type having a common side surface to the side surface of said first semiconductor layer and formed between said first and second main electrode regions, said second semiconductor layer reaching said bottom insulating film starting from the top surface of said first semiconductor layer.

4. A device of claim 1, wherein at least one of said first and second main electrode regions reaches said bottom insulating film starting from the top surface of said first semiconductor layer.

5. A device of claim 3, wherein at least one of said first and second main electrode regions reaches said bottom insulating film starting from the top surface of said first semiconductor layer.

6. A device of claim 1, wherein the thickness of said first semiconductor layer is 5 $\mu$m to 20 $\mu$m.

7. A device of claim 2, wherein the thickness of said first semiconductor layer is 5 $\mu$m to 20 $\mu$m.

8. A device of claim 3, wherein the thickness of said first semiconductor layer is 5 $\mu$m to 20 $\mu$m.

9. A semiconductor power device comprising:
   (a) a substrate;
   (b) a bottom insulating film formed on said substrate;
   (c) a first semiconductor layer of a first conductivity type having a top, a bottom and at least four side surfaces, formed on said bottom insulating film at a partial area thereof;
   (d) an element isolation region facing to said side surfaces and surrounding said first semiconductor layer, said element isolation region having a substantially vertical side well;
   (e) an element isolation insulating film formed on said side surfaces at an interface between said element isolation region and said first semiconductor layer;
   (f) a first main electrode region of the first conductivity type having a higher impurity concentration than that of the first semiconductor layer, formed in said first semiconductor layer at a partial area thereof; and (g) a second main electrode region of a second conductivity type formed in said first semiconductor layer at a partial area thereof, said second main electrode region being spaced apart from said first main electrode region, wherein a width W of said first semiconductor layer sandwiched by said element isolation insulating film between said first and second main electrode regions is 5 μm or narrower, said width W is $W_K$ near at said first main electrode region and $W_A$ near at said second main electrode region, where $W_K > W_A$.

10. A device of claim 9, wherein said width $W_A$ is 5 μm or narrower.

11. A device of claim 2, further comprising:

a gate insulating film formed on the top surface of said second semiconductor layer; and a gate electrode formed on said gate insulating film.

12. A device of claim 3, further comprising:

a gate insulating film formed on the side surface of said second semiconductor layer; and a gate electrode formed on said gate insulating film and in said element isolation region.

13. A device of claim 3, wherein said second semiconductor layer consisting of a pair of semiconductor regions, and the pair of semiconductor regions sandwiching a part of said first semiconductor layer between said first and second main electrode regions, contact windows being formed on the common side surface of said second semiconductor layer, and further comprising a gate electrode of high conductivity formed in said element isolation region facing to said contact windows, said gate electrode being in ohmic contact with the pair of semiconductor regions via said contact windows.

14. A device of claim 1, wherein both of said first and second main electrode regions reach said bottom insulating film starting from the top surface of said first semiconductor layer.

15. A device of claim 3, wherein both of said fist and second main electrode regions reach said bottom insulating film starting from the top surface of said first semiconductor layer.

16. A device of claim 14, wherein a boundary surface between said first main electrode region and said first semiconductor layer is vertical to the top surface of said first semiconductor layer.

17. A device of claim 14, wherein a boundary surface between said second main electrode region and said first semiconductor layer is vertical to the top surface of said first semiconductor layer.

18. A device of claim 15, wherein a boundary surface between said second semiconductor layer and said first semiconductor layer is vertical to the top surface of said first semiconductor layer.

19. A device of claim 15, wherein a boundary surface between said second main electrode region and said first semiconductor layer is vertical to the top surface of said first semiconductor layer.

* * * * *